United States Patent
Zhang et al.

[11] Patent Number: 5,903,038
[45] Date of Patent: May 11, 1999

[54] SEMICONDUCTOR SENSING DEVICE AND METHOD FOR FABRICATING THE SAME

[75] Inventors: Zuoying Lisa Zhang, Gilbert; Shang-Hui Larry Tu, Phoenix; Guang Xuan Li, Gilbert, all of Ariz.

[73] Assignee: Motorola, Inc., Schaumburg, Ill.

[21] Appl. No.: 08/885,266

[22] Filed: Jun. 30, 1997

[51] Int. Cl.⁶ .................................................. H01L 29/82
[52] U.S. Cl. .......................... 257/417; 257/418; 257/420
[58] Field of Search .................... 257/417, 418, 257/254, 420; 438/585, 739; 73/514.14, 514.15, 514.16, 514.21, 514.22, 514.23, 514.36, 514.37

[56] References Cited

U.S. PATENT DOCUMENTS

| | | | |
|---|---|---|---|
| 4,992,838 | 2/1991 | Mori | 257/356 |
| 5,503,017 | 4/1996 | Mizukoshi | 257/417 |
| 5,541,437 | 7/1996 | Watanabe et al. | 257/417 |
| 5,600,065 | 2/1997 | Kar et al. | 73/504.12 |
| 5,622,633 | 4/1997 | Ohtsuka et al. | 438/585 |
| 5,627,397 | 5/1997 | Kano et al. | 257/417 |
| 5,770,514 | 6/1998 | Matsuda et al. | 438/589 |

FOREIGN PATENT DOCUMENTS

| | | | |
|---|---|---|---|
| 0671629 | 9/1995 | European Pat. Off. | 15/12 |

*Primary Examiner*—Tom Thomas
*Assistant Examiner*—Cuong Quang Nguyen
*Attorney, Agent, or Firm*—George C. Chen

[57] ABSTRACT

A semiconductor sensing device (10) for sensing a lateral acceleration includes a field effect transistor (132) fabricated along a sidewall (114) of a trench (112) formed in a substrate (11). A movable gate (12) overlies a channel region (138) of the field effect transistor (132). In response to a lateral acceleration perpendicular to the sidewall (114) of the trench (112), the movable gate (12) moves relative to the substrate (11) in a direction substantially perpendicular to the sidewall (114). The conductive state of the channel region (138) depends on the distance between the movable gate (12) and the channel region (138) and changes in response to the lateral acceleration Thus, the motion of the movable gate (12) modulates a current flowing in the field effect transistor (132). The lateral acceleration is sensed by sensing the current flowing in the field effect transistor (132).

17 Claims, 3 Drawing Sheets

5,903,038

SEMICONDUCTOR SENSING DEVICE AND METHOD FOR FABRICATING THE SAME

BACKGROUND OF THE INVENTION

The present invention relates, in general, to semiconductor devices and, more particularly, to semiconductor sensing devices.

Acceleration sensors are used in motion sensing applications such as, for example, motion sensing for controlling air bags in automobiles. One type of acceleration sensor includes a field effect transistor having a movable gate structure. When the substrate on which the field effect transistor is fabricated experiences an acceleration in a normal direction perpendicular to the front surface of the substrate, the movable gate moves towards or away from the front surface of the substrate. A current flowing in the field effect transistor changes in response to the motion of the movable gate in the normal direction. An amplifier coupled to the field effect transistor amplifies the current change and senses the normal acceleration.

To sense an acceleration in a lateral direction substantially parallel to the front surface of the substrate, a field effect transistor is fabricated to have a movable gate that is movable in the lateral direction. When the substrate experiences a lateral acceleration, the motion of the movable gate changes the channel width of the field effect transistor, thereby modulating the current carrying capability of the field effect transistor. An amplifier coupled to the field effect transistor amplifies the current change in the field effect transistor and senses the lateral acceleration. However, the change in the channel width is usually very small compared with the channel width of the field effect transistor. Therefore, the sensitivity of the field effect transistor to the lateral acceleration is low, usually at least ten time lower than the sensitivity of a field effect transistor of comparable size to the normal acceleration.

Accordingly, it would be advantageous to have a semiconductor sensing device and a method for fabricating the semiconductor sensing device. It is desirable for the sensing device to be able to accurately sense a lateral acceleration. It is also desirable for the method for fabricating the sensing device to be cost efficient and compatible with standard Metal Oxide Semiconductor (MOS) technologies. It would be of further advantage if the sensing device is simple, reliable, and can be easily implemented with other integrated circuit devices in a monolithic semiconductor chip.

BRIEF DESCRIPTION OF THE DRAWINGS

It should be noted that the figures are not drawn to scale and that the same reference numerals are used in the figures to represent elements of similar structure and function.

DETAILED DESCRIPTION OF THE DRAWINGS

Generally, the present invention provides a semiconductor sensing device and a method for fabricating the sensing device. To form the sensing device of the present invention, a trench is formed in a semiconductor substrate. Through dopant implantation, a source region, a drain region, and a channel region of a field effect transistor (FET) are formed along a sidewall of the trench. A movable conductive structure overlies the channel region along the sidewall of the trench and serves as a movable gate of the FET. The movable gate structure is anchored to an anchoring region on the semiconductor substrate via a flexible supporting arm. In response to an acceleration perpendicular to the sidewall of the trench, the movable gate moves relative to the substrate in a direction substantially perpendicular to the sidewall. In other words, the distance between the movable gate and the channel region along the sidewall of the trench changes when there is an acceleration substantially perpendicular to the sidewall. The conductive state of the channel region depends on the distance between the movable gate and the channel region and changes in response to the acceleration. The source region, drain region, and the movable gate are biased so that a current flows through the channel region and the acceleration can be sensed by sensing the change in the current. Therefore, the sensing device can sense a lateral acceleration in a direction substantially parallel to the front surface of the semiconductor substrate on which the sensing device is fabricated.

Figure 1:
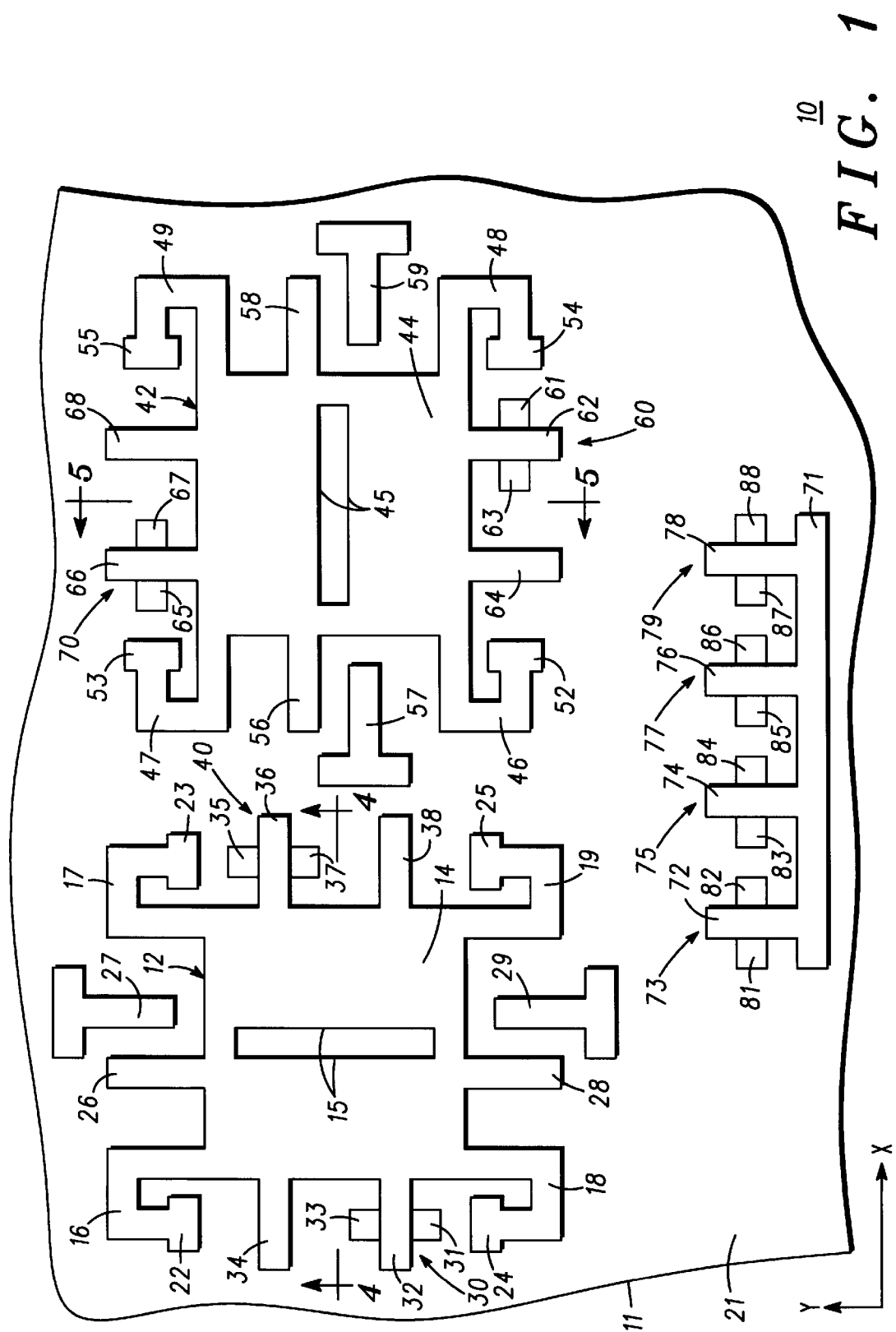
FIG. 1 is a schematic top view of a semiconductor sensing device in accordance with the present invention.

FIG. 1 is a schematic top view of a semiconductor sensing device 10 in accordance with the present invention. Sensing device 10 is fabricated on a semiconductor substrate 11 having a major surface 21. By way of example, substrate 11 is a silicon substrate of P conductivity type. Major surface 21 is also referred to as a front surface of substrate 11. Sensing device 10 includes movable gates 12 and 42 and is also referred to as a movable gate sensing device.

Movable gate 12 has a horizontal portion 14 overlying a portion of major surface 21 of substrate 11 and a vertical portion 15 along two sidewalls of an elongated trench (not shown in FIG. 1) formed in substrate 11. The two sidewalls of the elongated trench are substantially perpendicular to an X-direction. As shown in FIG. 1, the X-direction is substantially parallel to major surface 21 of substrate 11. There are two FETs (not shown in FIG. 1) formed in substrate 11 along the two sidewalls of the trench under movable gate 12. Movable gate 12 is attached to substrate 11 via flexible supporting arms 16, 17, 18, and 19 that are connected to anchoring regions 22, 23, 24, and 25, respectively, on substrate 11. Flexible supporting arms 16, 17, 18, and 19 allow movable gate 12 to move in the X-direction and a Z-direction (not shown in FIG. 1) that is substantially perpendicular to major surface 21. Movable gate 12 also has fingers 26 and 28 adjacent conductive structures 27 and 29, respectively, on substrate 11. Movable gate 12 further has fingers 32, 34, 36, and 38. Fingers 26 and 28 cooperate with conductive structures 27 and 29, respectively, to test and calibrate the motion of movable gate 12 in the X-direction. In one embodiment, fingers 34 and 38 cooperate with two conductive regions (not shown) therebelow in substrate 11 to test and calibrate the motion of movable gate 12 in the Z-direction. In an alternative embodiment, horizontal portion 14 of movable gate 12 cooperates with a conductive region (not shown) therebelow in substrate 11 to test and calibrate the motion of movable gate 12 in the Z-direction. Therefore, fingers 34 and 38 are optional in sensing device 10 in the alternative embodiment. A source region 31 and a drain region 33 in substrate 11 defines a channel region (not shown) therebetween and under finger 32. Finger 32, source region 31, drain region 33, and the channel region under finger 32 form a FET 30. Finger 32 serves as a movable gate of FET 30. Thus, FET 30 has a movable gate structure 32 that is movable relative to major surface 21 and attached to movable gate 12. A source region 35 and a drain region 37 in substrate 11 defines a channel region (not shown) therebetween and under finger 36. Finger 36, source region 35, drain region 37, and the channel region under finger 36 form a FET 40. Finger 36 serves as a movable gate of FET 40. Thus, FET 40 has a movable gate structure 36 that is movable relative to major surface 21 and mechanically connected to movable gate 12.

Movable gate 42 has a horizontal portion 44 overlying a portion of major surface 21 of substrate 11 and a vertical portion 45 along two sidewalls of an elongated trench (not shown in FIG. 1) formed in substrate 11. The two sidewalls of the elongated trench are substantially perpendicular to a Y-direction. As shown in FIG. 1, the Y-direction is substantially parallel to major surface 21 and substantially perpendicular to the X-direction. There are two FETs (not shown in FIG. 1) formed in substrate 11 along the two sidewalls of the trench under movable gate 42. Movable gate 42 is attached to substrate 11 via flexible supporting arms 46, 47, 48, and 49 that are connected to anchoring regions 52, 53, 54, and 55, respectively, on substrate 11. Flexible supporting arms 46, 47, 48, and 49 allow movable gate 42 to move in the Y-direction and the Z-direction. Movable gate 42 also has fingers 56 and 58 adjacent conductive structures 57 and 59, respectively, on substrate 11. Movable gate 42 further has fingers 62, 64, 66, and 68. Fingers 56 and 58 cooperate with conductive structures 57 and 59, respectively, to test and calibrate the motion of movable gate 42 in the Y-direction. In one embodiment, fingers 64 and 68 cooperate with two conductive regions (not shown) therebelow in substrate 11 to test and calibrate the motion of movable gate 42 in the Z-direction. In an alternative embodiment, horizontal portion 44 of movable gate 42 cooperates with a conductive region (not shown) therebelow in substrate 11 to test and calibrate the motion of movable gate 42 in the Z-direction. Therefore, fingers 64 and 68 are optional in sensing device 10 in the alternative embodiment. A source region 61 and a drain region 63 in substrate 11 defines a channel region (not shown) therebetween and under finger 62. Finger 62, source region 61, drain region 63, and the channel region under finger 62 form a FET 60. Finger 62 serves as a movable gate of FET 60. Thus, FET 60 has a movable gate structure 62 that is movable relative to major surface 21 and attached to movable gate 42. A source region 65 and a drain region 67 in substrate 11 defines a channel region (not shown) therebetween and under finger 66. Finger 66, source region 65, drain region 67, and the channel region under finger 66 form a FET 70. Finger 66 serves as a movable gate of FET 70. Thus, FET 70 has a movable gate structure 66 that is movable relative to major surface 21 and mechanically connected to movable gate 42.

Sensing device 10 further includes a conductive structure 71 that is substantially rigidly attached to substrate 11. Conductive structure 71 has fingers 72, 74, 76, and 78. Fingers 72, 74, 76, and 78 serve as fixed gate structures for FETs 73, 75, 77, and 79, respectively. FET 73 includes a source region 81, a drain region 82 in substrate 11, and a channel region (not shown) therebetween and under fixed gate structure 72. FET 75 includes a source region 83, a drain region 84 in substrate 11, and a channel region (not shown) therebetween and under fixed gate structure 74. FET 77 includes a source region 85, a drain region 86 in substrate 11, and a channel region (not shown) therebetween and under fixed gate structure 76. FET 79 includes a source region 87, a drain region 88 in substrate 11, and a channel region (not shown) therebetween and under fixed gate structure 78. Preferably, fixed gate structures 72, 74, 76, and 78 are positioned above major surface 21 at a distance substantially equal to a distance at which fingers 32, 36, 66, and 68 are positioned above major surface 21.

In operation, the two FETs (not shown in FIG. 1) along the two sidewalls of the elongated trench (not shown in FIG. 1) under movable gate 12 generate a first differential signal in response to an acceleration in the X-direction. Likewise, the two FETs (not shown in FIG. 1) along the two sidewalls of the elongated trench (not shown in FIG. 1) under movable gate 42 generate a second differential signal in response to an acceleration in the Y-direction. Movable gate FETs 30, 40, 60, and 70 generate a signal in response to an acceleration in the Z-direction. The signal is compared with a reference signal generated by fixed gate FETs 73, 75, 77, and 79 to generate a third differential signal. Using circuit elements (not shown) such as, for example, differential amplifiers to sense the three differential signals, sensing device 10 is capable of sensing an acceleration in any direction with respect to substrate 11.

Figure 2:
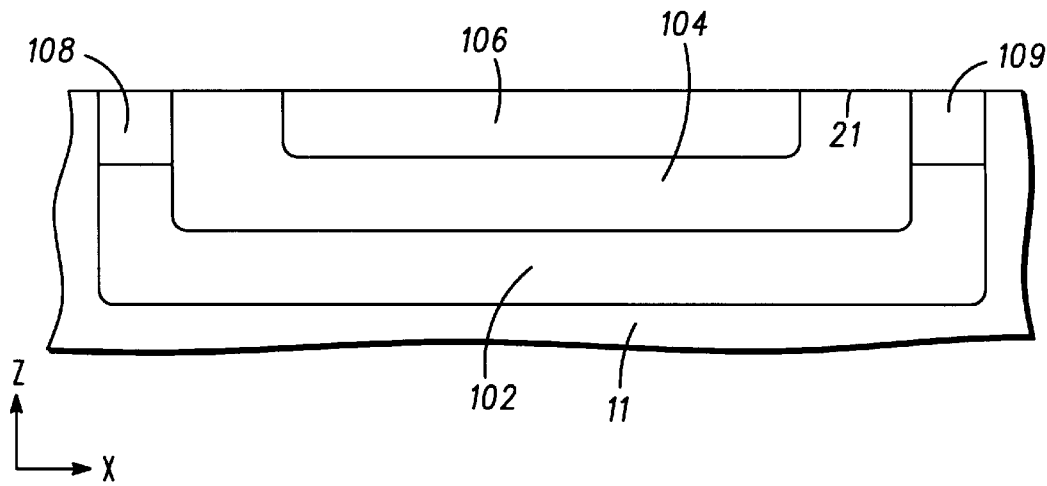
FIGS. 2–5 illustrate, in cross-sectional views, a method for fabricating a semiconductor sensing device in accordance with the present invention.
Figure 3:
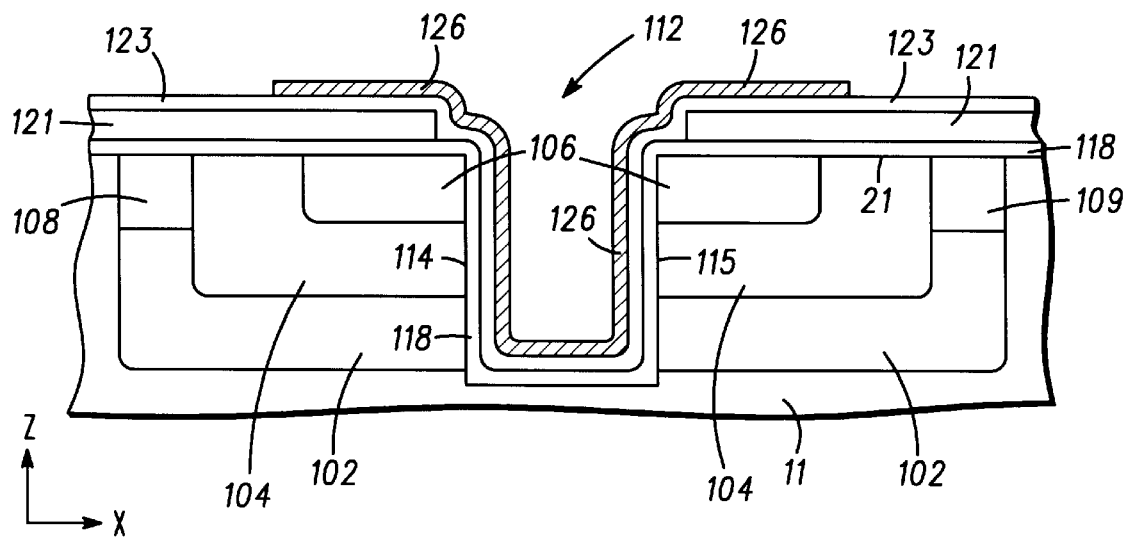
Figure 4:
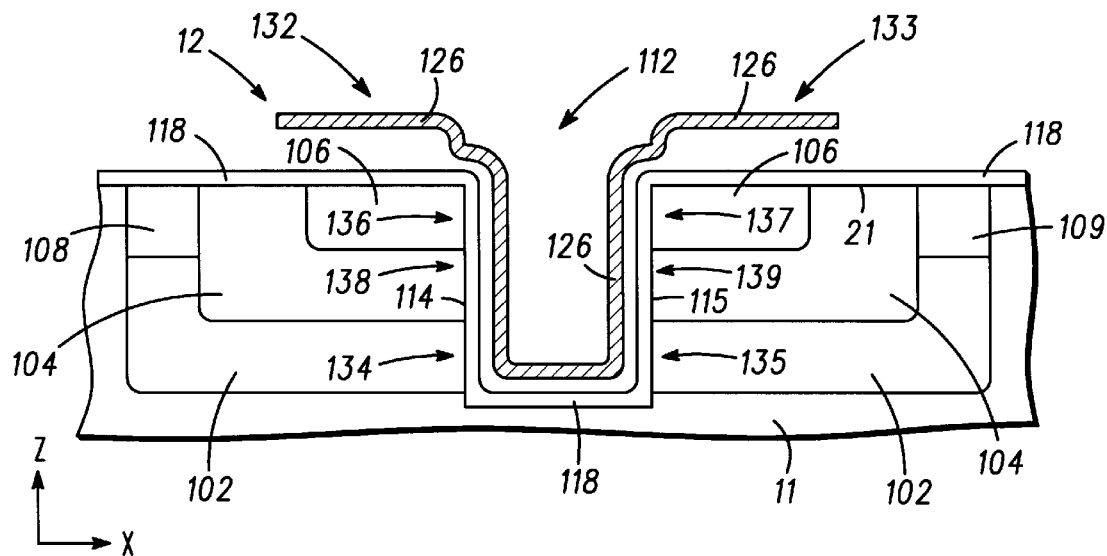
Figure 5:
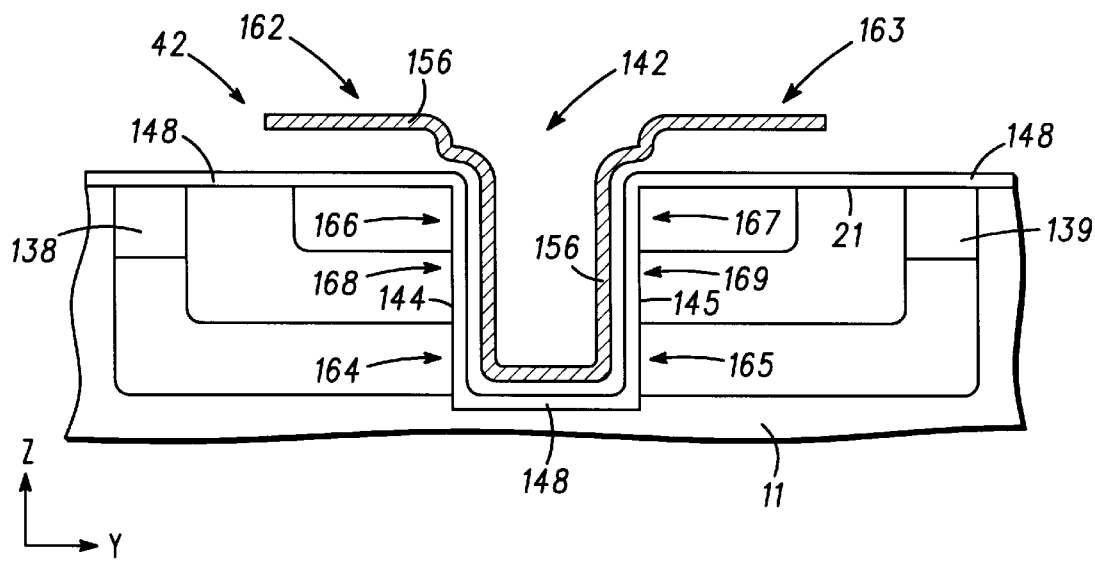

FIGS. 2–5 illustrate a method for fabricating sensing device 10 in accordance with the present invention by schematically showing portions of substrate 11 at different stages of the fabrication process. More particularly, FIG. 4 is a cross-sectional view of substrate 11 along a cross-sectional line 4—4 in FIG. 1, and FIGS. 2 and 3 show the same cross section of substrate 11 at earlier stages of the fabrication process. FIG. 5 is a cross-sectional view of substrate 11 along a cross-sectional line 5—5 in FIG. 11

Referring to FIG. 2, ions of N conductivity type such as, for example, phosphorus ions are implanted into substrate 11 to form an N conductivity type doped region 102. By way of example, doped region 102 extends from major surface 21 into substrate 11 to a depth between approximately 1000 nanometers (nm) and approximately 2000 nm. Ions of P conductivity type such as, for example, boron ions are implanted through the openings in a mask (not shown) into substrate 11 to form a P conductivity type doped region 104 that is surrounded by doped region 102. Doped region 104 extends from major surface 21 into substrate 11 to a depth that is preferably less than that of doped region 102. By way of example, the depth of doped region 104 is between approximately 500 nm and approximately 1500 nm. Ions of N conductivity type such as, for examples arsenic ions are implanted through the openings in a mask (not shown) into substrate 11 to form an N conductivity type doped region 106 in doped region 104 and N conductivity type doped regions 108 and 109 in doped region 102 outside doped region 104. Doped region 106 extends from major surface 21 into substrate 11 to a depth that is preferably less than that of doped region 104. By way of example, the depth of doped region 106 is between approximately 200 nm and approximately 800 nm.

The process of implanting ions into substrate 11 typically includes forming field oxide regions (not shown) over inactive regions of substrate 11, forming a pad dielectric layer (not shown) over major surface 21, forming a photoresist mask (not shown) on the pad dielectric layer, implanting ions through the openings in the photoresist mask, stripping the photoresist mask, heating substrate 11 to drive the implanted ions into substrate 11. These steps are compatible with standard Metal Oxide Semiconductor (MOS) fabrication process. In subsequent steps, movable gate 12 (shown in FIG. 1) will be formed over doped region 102. Preferably, the process of forming doped region 106 also forms source regions 31, 35, 81, 83, 85, and 87, and drain regions 33, 37, 82, 84, 86, and 88 (shown in FIG. 1). In the embodiment in which fingers 34 and 38 (shown in FIG. 1) cooperate with two conductive regions (not shown) therebelow in substrate 11 to test and calibrate the motion of movable gate 12 in the Z-direction, the process of forming doped region 106 preferably also forms the conductive regions under fingers 34 and 38. In the alternative embodiment in which horizontal portion 14 of movable gate 12 cooperates with a conductive region therebelow in substrate 11 to test and calibrate the motion of movable gate 12 in the Z-direction, the process of forming doped region 106 preferably also forms the conductive region under horizontal portion 14 of movable gate 12.

Referring now to FIG. 3, a trench 112 is formed in substrate 11. Trench 112 extends from major surface 21 into substrate 11 to a depth that is preferably greater than the depth of doped region 104. By way of example, the depth of trench 112 is between approximately 1500 nm and approximately 3000 nm. A sidewall 114 of trench 112 is substantially perpendicular to major surface 21. Another sidewall 115 of trench 112 is substantially parallel to sidewall 114. Sidewalls 114 and 115 are also referred to as edges of trench 112. A direction substantially perpendicular to sidewalls 114 and 115 is referred to as the X-direction. A direction substantially perpendicular to major surface 21 of substrate 11 is referred to as the Z-direction.

To form trench 112, a pad dielectric layer (not shown) is disposed over major surface 21. By way of example, the pad dielectric layer includes a pad oxide layer having a thickness between approximately 20 nm and approximately 80 nm on major surface 21 and a nitride layer having a thickness between approximately 80 nm and approximately 300 nm on the pad oxide layer. An oxide layer (not shown) having a thickness between, for example, approximately 100 nm and approximately 1000 nm is deposited on the pad dielectric layer and serves as a hard mask. The hard mask and the pad dielectric layer are patterned to expose portions of major surface 21. An etching process, e.g., a reactive ion etching process, is used to etch substrate 11 through the openings in the hard mask and the pad dielectric layer to form trench 112. The hard mask and the pad dielectric layer are then removed.

A dielectric layer 118 is disposed along sidewalls 114 and 115 of trench 112 and over major surface 21. In a preferred embodiment, dielectric layer 118 includes an oxide layer having a thickness between, for example, approximately 5 nm and approximately 40 nm on major surface 21 and a nitride layer having a thickness between, for example, approximately 70 nm and approximately 200 nm on the oxide layer. A sacrificial layer 121 is deposited on dielectric layer 118. By way of example, sacrificial layer 121 is a layer of phosphorus doped silicate glass and has a thickness between approximately 500 nm and approximately 2000 nm. Sacrificial layer 121 is patterned and selectively etched to expose dielectric layer 118 in trench 112 and portions of dielectric layer 118 over major surface 21. Another sacrificial layer 123, e.g., a second phosphorus doped silicate glass layer having a thickness ranging from approximately 50 nm to approximately 400 nm, is disposed over dielectric layer 118 and sacrificial layer 121. Sacrificial layer 123 is patterned and selectively etched to expose portions of dielectric layer 118 overlying anchoring regions (not shown in FIG. 3) on substrate 11. A conductive layer 126 is disposed conformally over substrate 11. In a preferred embodiment, conductive layer 126 is a polycrystalline silicon layer having a thickness between, for example, approximately 500 nm and approximately 3000 nm. Conductive layer 126 is patterned to form movable gates 12. Preferably, conductive layer 126 is doped to increase its conductivity.

A wet etching process is performed to remove sacrificial layers 121 and 123 between conductive layer 126 and dielectric layer 118. As shown in FIG. 4, there is a gap between conductive layer 126 and dielectric layer 118 outside the anchoring regions (not shown in FIG. 4) after the etching process. Conductive layer 126 is attached to anchoring regions 22, 23, 24, 25 of substrate 11 via flexible supporting arms 16, 17, 18, and 19, respectively (shown in FIG. 1). Conductive layer 126 functions as movable gate 12. Flexible supporting arms 16, 17, 18, and 19 are preferably patterned so that movable gate 12 can move in the X-direction and the Z-direction when substrate 11 experiences an acceleration in the X-direction and the Z-direction, respectively. It should be understood that some features of movable gate 12, e.g., fingers 26, 28, 32, 34, 36, and 38 and flexible supporting arms 16, 17, 18, and 19 (shown in FIG. 1), are not shown in FIG. 4 because of limitations of the two dimensional cross-sectional view.

Movable gate 12 and doped regions 102, 104, and 106 adjacent sidewall 114 of trench 112 form a FET 132. A portion of doped region 102 adjacent sidewall 114 functions as a source region 134 of FET 132. A portion of doped region 106 adjacent sidewall 114 functions as a drain region 136 of FET 132. A portion of doped region 104 adjacent sidewall 114 functions as a channel region 138 of FET 132. As shown in FIG. 4, channel region 138 is between source region 134 and drain region 136. In other words, channel region 138 separates source region 134 from drain region 136. Doped region 108 functions as a source contact of FET 132. Likewise, movable gate 12 and doped regions 102, 104, and 106 adjacent sidewall 115 of trench 112 form a FET 133. A portion of doped region 102 adjacent sidewall 115 functions as a source region 135 of FET 133. A portion of doped region 106 adjacent sidewall 115 functions as a drain region 137 of FET 133. A portion of doped region 104 adjacent sidewall 115 functions as a channel region 139 of FET 133. As shown in FIG. 4 channel region 139 is between source region 135 and drain region 137. In other words, channel region 139 separates source region 135 from drain region 137. Doped region 109 functions as a source contact of FET 133. Preferably, the dopant concentrations in doped regions 108 and 109 are sufficiently high so that the source contacts between doped region 108 and source region 134 in FET 132 and between doped region 109 and source region 135 in FET 133 are ohmic contacts. Further, the characteristics of FET 133 preferably substantially matches those of FET 132. Thus, sensing device 10 operates substantially symmetrically with respect to FETs 132 and 133.

In operation, voltage biases are applied to source region 134 and drain region 136 of FET 132, source region 135 and drain region 137 of FET 133, and movable gate 12. Preferably, movable gate 12 is so biased that FETs 132 and 133 are weakly turned on. Therefore, the currents flowing in channel regions 138 and 139 are sensitive to the position of movable gate 12 relative to sidewalls 114 and 115, respectively, of trench 112. When sensing device 10 experiences an acceleration in the X-direction, movable gate 12 moves with respect to sidewall 114 and 115, respectively. The currents flowing in channel regions 138 and 139 change in response to the motion of movable gate 12 relative to sidewalls 114 and 115. The change in the current flowing in channel region 138 is opposite to that flowing in channel region 139. A circuit element such as, for example, a differential amplifier (not shown) coupled to FETs 132 and 133 senses the current changes, thereby sensing the acceleration in the X-direction.

If sensing device 10 experiences an acceleration in the positive X-direction, movable gate 12 moves towards sidewall 114. The distance between movable gate 12 and sidewall 114 decreases. The threshold voltage of FET 132 decreases and the current flowing in channel region 138 increases FET 132 generates a positive current swing. On the other hand, the distance between movable gate 12 and sidewall 115 increases. The threshold voltage of FET 133 increases and the current flowing in channel region 139 decreases. FET 133 generates a negative current swing. The differential amplifier (not shown) coupled to FETs 132 and 133 senses the positive and negative current swings in FETs 132 and 133, respectively, and senses the acceleration in the positive X-direction.

If sensing device 10 experiences an acceleration in the negative X-direction, movable gate 12 moves away from sidewall 114. The distance between movable gate 12 and sidewall 114 increases. The threshold voltage of FET 132 increases and the current flowing in channel region 138 decreases. FET 132 generates a negative current swing. On the other hand, the distance between movable gate 12 and sidewall 115 decreases. The threshold voltage of FET 133 decreases and the current flowing in channel region 139 increases. FET 133 generates a positive current swing. The differential amplifier (not shown) coupled to FETs 132 and 133 amplifies the negative and positive current swings in FETs 132 and 133, respectively, and senses the acceleration in the negative X-direction.

FIG. 5 shows a trench 142 under movable gate 42 and FETs 162 and 163 along edges 144 and 145, respectively, of trench 142. Edges 144 and 145, which are also referred to as sidewalls, of trench 142 are preferably substantially perpendicular to the Y-direction. A dielectric layer 148 overlies edges 144 and 145 of trench 142. Movable gate 42 is patterned from a conductive layer 156 deposited over a sacrificial layer (not shown) over substrate 11. The sacrificial layer is then removed using an etching process Conductive layer 156 is attached to anchoring regions 52, 53, 54, 55 of substrate 11 via flexible supporting arms 46, 47, 48, and 49, respectively (shown in FIG. 1). Conductive layer 156 functions as movable gate 42. Flexible supporting arms 46, 47, 48, and 49 are preferably patterned so that movable gate 42 can move in the Y-direction and the Z-direction when substrate 11 experiences an acceleration in the Y-direction and the Z-direction, respectively. It should be understood that some features of movable gate 42, e.g., fingers 56, 58, 62, 64, 66, and 68 and flexible supporting arms 46, 47, 48, and 49 (shown in FIG. 1), are not shown in FIG. 5 because of limitations of the two dimensional cross-sectional view.

FET 162 has a source region 164 and a drain region 166 adjacent edge 144. Source region 164 and drain region 166 define a channel region 168 therebetween. Movable gate 42 overlies channel region 168. A doped region 138 adjacent major surface 21 serves as a source contact of FET 162. FET 163 has a source region 165 and a drain region 167 adjacent edge 145. Source region 165 and drain region 167 define a channel region 169 therebetween. Movable gate 42 also overlies channel region 169. A doped region 139 adjacent major surface 21 serves as a source contact of FET 163. The process of forming doped regions 138 and 139 preferably also forms source regions 61 and 65 and drain regions 63, 67 (shown in FIG. 1). In the embodiment in which fingers 64 and 68 (shown in FIG. 1) cooperate with two conductive regions (not shown) therebelow in substrate 11 to test and calibrate the motion of movable gate 42 in the Z-direction, the process of forming doped regions 138 and 139 preferably also forms the conductive regions under fingers 64 and 68. In the alternative embodiment in which horizontal portion 44 of movable gate 42 cooperates with a conductive region therebelow to test and calibrate the motion of movable gate 42 in the Z-direction, the process of forming doped regions 138 and 139 preferably also forms the conductive region under horizontal portion 44 of movable gate 42.

Referring now to both FIGS. 4 and 5, the structures and characteristics of FETs 162 and 163 are preferably substantially the same as those of FETs 132 and 133. The process steps of forming trench 142, dielectric layer 148, and movable gate 42 are preferably performed in the same process steps that form trench 112, dielectric layer 118, and movable gate 12, respectively. In other words, FETs 132 and 133 under movable gate 12 and FETs 162 and 163 under movable gate 42 are preferably formed in the same process steps. However, this is not a limitation of the present invention. FETs 162 and 163 under movable gate 42 can be formed in different process steps from those forming FETs 132 and 133 under movable gate 12. Further, the structures and characteristics of FETs 162 and 163 can be different from those of FETs 132 and 133.

Sensing device 10 senses an acceleration in the Y-direction in a way analogous to that described above with reference to sensing an acceleration in the X-direction. When sensing device 10 experiences an acceleration in the Y-direction, movable gate 42 moves with respect to edges 144 and 145 of trench 142. The currents flowing in channel regions 168 and 169 of FETs 162 and 163, respectively, change in response to the motion of movable gate 42. A circuit element such as, for example, a differential amplifier (not shown) coupled to FETs 162 and 163 senses the current changes, thereby sensing the acceleration in the Y-direction.

Referring now back to FIG. 1, movable gates 12 and 42 move in a direction perpendicular to major surface 21 when sensing device 10 experiences an acceleration in the Z-direction. The threshold voltages of FETs 30, 40, 60, and 70 change in response to the motion of movable gates 12 and 42 in the Z-direction. Thus, the current flowing in the channel regions under fingers 32, 36, 62, and 66 change and FETs 30, 40, 60, and 70 generate a current swing. Because conductive structure 71 is substantially rigidly attached to substrate 11, the currents flowing in FETs 73, 75, 77, and 79 are substantially unaffected by the acceleration in the Z-direction. FETs 73, 75, 77, and 79 generate a reference current signal. The current swing generated by FETs 30, 40, 60, and 70 and the reference current signal generated by FETs 73, 75, 77, and 79 cooperate to generate a differential signal. A circuit element such as, for example, a differential amplifier (not shown) senses the differential signal and senses the acceleration in the Z-direction. Preferably, the number of FETs, e.g., FETs 73, 75, 77, and 79, that generate the reference signal is equal to the number of FETs, e.g., FETs 30, 40, 60, and 70, that generate current swings in response to the acceleration in the Z-direction.

It should be understood that the structure of sensing device 10 is not limited to being that shown in FIGS. 1–5 and described hereinbefore. For example, each of movable gates 12 and 42 is not limited to having four flexible supporting arms as shown in FIG. 1. A movable gate structure in sensing device 10 can have any number of flexible supporting arms, e.g., two, three, five, six, etc.

The number of fingers, e.g., fingers 26 and 28 shown in FIG. 1, attached to movable gate 12 for testing and calibrating the motion of movable gate 12 in the X-direction is not limited to being two. The number of fingers, e.g., fingers 56 and 58 shown in FIG. 1, attached to movable gate 42 for testing and calibrating the motion of movable gate 42 in the Y-direction is not limited to being two either. Sensing device 10 can include any number, e.g., one, three, four, five, etc., of fingers attached to movable gate 12 for testing and calibrating the motion of movable gate 12 in the X-direction. Likewise, sensing device 10 can include any number of fingers attached to movable gate 42 for testing and calibrating the motion of movable gate 42 in the Y-direction.

Movable conductive structure 32, 34, 36, and 38 (shown in FIG. 1) are not limited to being attached to movable gate 12. Movable conductive structure 62, 64, 66, and 68 (shown in FIG. 1) are not limited to being attached to movable gate 42 either. In an alternative embodiment, movable conductive structures 32, 34, 36, 38, 62, 64, 66, and 68 for sensing an acceleration in the Z-direction are connected to each other to form a movable conductive structure (not shown) that is separated from movable gates 12 and 42 and anchored to substrate 11 via flexible supporting arms (not shown). In another alternative embodiment, all movable conductive structures, e.g., movable conductive structures 32, 34, 36, and 38, for sensing an acceleration in the Z-direction are attached to movable gate 12, i.e., movable conductive structures 62, 64, 66, 68 are absent from sensing device 10. In yet another alternative embodiment, all movable conductive structures, e.g., movable conductive structures 62, 64, 66, and 68, for sensing an acceleration in the Z-direction are mechanically connected to movable gate 42, i.e, movable conductive structures 32, 34, 36, 38 are absent from sensing device 10.

Under movable gate 12, either FET 132 (shown in FIG. 4) along sidewall 114 of trench 112 or FET 133 (shown in FIG. 4) along sidewall 115 of trench 112 is optional. In an alternative embodiment, a single FET, e.g., FET 132 along sidewall 114 of trench 112, generates a current swing in response to an acceleration in the X-direction. A circuit element such as, for example, an amplifier (not shown) coupled to FET 132 amplifies the current swing and senses the acceleration in the X-direction. Likewise, one of two FETs 162 and 163 (shown in FIG. 5) is optional in sensing device 10. Further, fixed conductive structure 71, source regions 81, 83, 85, and 87, and drain regions 82, 84, 86, and 88 are optional. In an alternative embodiment that does not includes fixed conductive structure 71, a circuit element such as, for example, an amplifier (not shown) coupled to FETs 30, 40, 60, and 70 amplifies current swings in FETs 30, 40, 60, and 70 in response to an acceleration in the Z-direction and senses the acceleration.

Movable gate 42, which is referred to as a proof mass, and trench 142 are optional in sensing device 10. A sensing device that does not include movable gate 42 and trench 142 is capable of sensing an acceleration in the X-direction and in the Z-direction. Alternatively, movable gate 12, which is referred to as a proof mass, and trench 112 are optional in sensing device 10. A sensing device that does not include movable gate 12 and trench 112 is capable of sensing an acceleration in the Y-direction and in the Z-direction. If sensing device 10 is designed to sense only a lateral acceleration in the X-direction and the Y-direction fingers 32, 34, 36, and 38 attached to movable gate 12, fingers 62, 64, 66, and 68 attached to movable gate 42, and conductive structure 71 (shown in FIG. 1) can be absent from sensing device 10.

By now it should be appreciated that a semiconductor sensing device and a method for fabricating the sensing device have been provided. The sensing device includes a movable gate FET fabricated on a sidewall of a trench formed in a semiconductor substrate. The sidewall of the trench is substantially perpendicular to the front surface of the substrate. In response to a lateral acceleration substantially perpendicular to the sidewall of the trench, the movable gate structure moves relative to the substrate, thereby modulating the distance between the movable gate and the sidewall of the trench. The conductive state of the FET changes in response to the acceleration. Thus, the lateral acceleration can be sensed by sensing a current flowing through the FET. Because the distance between the movable gate and the sidewall of the trench can be much smaller than the channel width of the FET, the sensitivity to the lateral acceleration of the sensing device of the present invention is significantly higher than that of the prior art movable gate sensing device. The sensing device of the present invention is simple, reliable, and cost efficient. Further, the sensing device can be fabricated on a chip that includes other semiconductor integrated circuit devices to form a monolithic integrated circuit chip.

We claim:

1. A semiconductor sensing device, comprising:
   a semiconductor substrate having a major surface and a first trench formed therein, the first trench having a first sidewall substantially perpendicular to the major surface;
   a first source region in the semiconductor substrate adjacent the first sidewall of the first trench;
   a first drain region in the semiconductor substrate adjacent the first sidewall of the first trench;
   a first channel region in the semiconductor substrate between the first source region and the first drain region;
   a first conductive structure overlying the first channel region and movable in a first direction substantially perpendicular to the first sidewall of the first trench;
   a second source region in the semiconductor substrate adjacent the major surface;
   a second drain region in the semiconductor substrate adjacent the major surface;
   a second channel region in the semiconductor substrate between the second source region and the second drain region; and
   a second conductive structure overlying the second channel region and movable in a second direction substantially perpendicular to the major surface.

2. The semiconductor sensing device of claim 1, further comprising a dielectric layer over the first sidewall of the first trench.

3. The semiconductor sensing device of claim 2, wherein the dielectric layer includes an oxide layer on the first sidewall of the first trench and a nitride layer on the oxide layer.

4. The semiconductor sensing device of claim 1, wherein:
   the first trench further has a second sidewall substantially parallel to the first sidewall of the first trench;
   the semiconductor sensing device further comprises:
      a third source region in the semiconductor substrate adjacent the second sidewall of the first trench;
      a third drain region in the semiconductor substrate adjacent the second sidewall of the first trench; and
      a third channel region in the semiconductor substrate between the third source region and the third drain region; and
   the first conductive structure further overlies the third channel region.

5. The semiconductor sensing device of claim 1, wherein the second conductive structure is attached to the first conductive structure.

6. The semiconductor sensing device of claim 1, further comprising:

a third source region in the semiconductor substrate adjacent the major surface;

a third drain region in the semiconductor substrate adjacent the major surface;

a third channel region in the semiconductor substrate between the third source region and the third drain region; and a third conductive structure overlying the third channel region and substantially rigidly attached to the semiconductor substrate.

7. A semiconductor sensing device, comprising:

a semiconductor substrate having a major surface and a first trench formed therein, the first trench having a first sidewall substantially perpendicular to the major surface;

a first source region in the semiconductor substrate adjacent the first sidewall of the first trench;

a first drain region in the semiconductor substrate adjacent the first sidewall of the first trench;

a first channel region in the semiconductor substrate between the first source region and the first drain region; and a first conductive structure overlying the first channel region and movable in a first direction substantially perpendicular to the first sidewall of the first trench, wherein the semiconductor substrate further has a second trench formed therein, the second trench having a first sidewall substantially perpendicular to the major surface and to the first sidewall of the first trench, and wherein the semiconductor sensing device further comprises:

a second source region in the semiconductor substrate adjacent the first sidewall of the second trench;

a second drain region in the semiconductor substrate adjacent the first sidewall of the second trench;

a second channel region in the semiconductor substrate between the second source region and the second drain region; and a second conductive structure overlying the second channel region and movable in a second direction substantially perpendicular to the first sidewall of the second trench.

8. The semiconductor sensing device of claim 7, wherein:

the second trench further has a second sidewall substantially parallel to the first sidewall of the second trench;

the semiconductor sensing device further comprises:

third source region in the semiconductor substrate adjacent the second sidewall of the second trench;

a third drain region in the semiconductor substrate adjacent the second sidewall of the second trench; and a third channel region in the semiconductor substrate between the third source region and the third drain region; and the second conductive structure further overlies the third channel region.

9. A movable gate sensing device, comprising:

a semiconductor substrate having a major surface and a first trench formed therein, the first trench having a first edge and a second edge substantially parallel to each other and substantially perpendicular to the major surface;

a first source region in the semiconductor substrate adjacent the first edge of the first trench;

a first drain region in the semiconductor substrate adjacent the first edge of the first trench;

a first channel region in the semiconductor substrate between the first source region and the first drain region;

a second source region in the semiconductor substrate adjacent the second edge of the first trench;

a second drain region in the semiconductor substrate adjacent the second edge of the first trench;

a second channel region in the semiconductor substrate between the second source region and the second drain region;

a first movable gate structure overlying the first channel region and the second channel region, the first movable gate structure being movable in a first direction substantially perpendicular to the first edge of the first trench;

a third source region in the semiconductor substrate adjacent the major surface;

a third drain region in the semiconductor substrate adjacent the major surface;

a third channel region in the semiconductor substrate between the third source region and the third drain region;

a second movable gate structure overlying the third channel region, the second movable gate structure being movable in a second direction substantially perpendicular to the major surface;

a fourth source region in the semiconductor substrate adjacent the major surface;

a fourth drain region in the semiconductor substrate adjacent the major surface;

a fourth channel region in the semiconductor substrate between the fourth source region and the fourth drain region; and a fixed gate structure overlying the fourth channel region.

10. The movable gate sensing device of claims 9, further comprising a dielectric layer over the first channel region and the second channel region.

11. The movable gate sensing device of claim 9, wherein the second movable gate structure is mechanically connected to the first movable gate structure.

12. A movable rate sensing device, comprising:

a semiconductor substrate having a major surface and a first trench formed therein, the first trench having a first edge and a second edge substantially parallel to each other and substantially perpendicular to the major surface;

a first source region in the semiconductor substrate adjacent the first edge of the first trench;

a first drain region in the semiconductor substrate adjacent the first edge of the first trench;

a first channel region in the semiconductor substrate between the first source region and the first drain region;

a second source region in the semiconductor substrate adjacent the second edge of the first trench;

a second drain region in the semiconductor substrate adjacent the second edge of the first trench;

a second channel region in the semiconductor substrate between the second source region and the second drain region; and a first movable rate structure overlying the first channel region and the second channel region, the first movable gate structure being movable in a first direction substantially perpendicular to the first edge of the first trench, wherein the semiconductor substrate further has a second trench formed therein, the second trench having a first edge and a second edge substantially parallel to each other and substantially perpendicular to the major surface and to the first edge of the first trench, and wherein the movable gate sensing device further comprises:
  a third source region in the semiconductor substrate adjacent the first edge of the second trench;
  a third drain region in the semiconductor substrate adjacent the first edge of the second trench;
  a third channel region in the semiconductor substrate between the third source region and the third drain region;
  a fourth source region in the semiconductor substrate adjacent the second edge of the second trench;
  a fourth drain region in the semiconductor substrate adjacent the second edge of the second trench;
  a fourth channel region in the semiconductor substrate between the fourth source region and the fourth drain region; and
  a second movable gate structure overlying the third channel region and the fourth channel region, the second movable gate structure being movable in a second direction substantially perpendicular to the first edge of the second trench.

13. A semiconductor sensing device, comprising:
a semiconductor substrate having a major surface and a first trench formed therein, the first trench having a first sidewall substantially perpendicular to the major surface;
a first source region in the semiconductor substrate adjacent the first sidewall of the first trench;
a first drain region in the semiconductor substrate adjacent the first sidewall of the first trench;
a first channel region in the semiconductor substrate between the first source region and the first drain region;
a first conductive structure overlying the first channel region and movable in a first direction substantially perpendicular to the first sidewall of the first trench;
a second source region in the semiconductor substrate adjacent the major surface;
a second drain region in the semiconductor substrate adjacent the major surface,
a second channel region in the semiconductor substrate between the second source region and the second drain region; and
a second conductive structure overlying the second channel region and movable in a second direction substantially perpendicular to the manor surface,
wherein:
  the first trench further has a second sidewall substantially parallel to the first sidewall of the first trench;
  the semiconductor sensing device further comprises:
    a third source region in the semiconductor substrate adjacent the second sidewall of the first trench;
    a third drain region in the semiconductor substrate adjacent the second sidewall of the first trench; and
    a third channel region in the semiconductor substrate between the third source region and the third drain region; and
  the first conductive structure further overlies the third channel region.

14. The semiconductor sensing device of claim 13, wherein the second conductive structure is attached to the first conductive structure.

15. A semiconductor sensing device, comprising:
a semiconductor substrate having a major surface and a first trench formed therein, the first trench having a first sidewall substantially perpendicular to the major surface;
a first source region in the semiconductor substrate adjacent the first sidewall of the first trench;
a first drain region in the semiconductor substrate adjacent the first sidewall of the first trench;
a first channel region in the semiconductor substrate between the first source region and the first drain region;
a first conductive structure overlying the first channel region and movable in a first direction substantially perpendicular to the first sidewall of the first trench;
a second source region in the semiconductor substrate adjacent the major surface;
a second drain region in the semiconductor substrate adjacent the major surface;
a second channel region in the semiconductor substrate between the second source region and the second drain region;
a second conductive structure overlying the second channel region and movable in a second direction substantially perpendicular to the major surface,
a third source region in the semiconductor substrate adjacent the major surface;
a third drain region in the semiconductor substrate adjacent the major surface;
a third channel region in the semiconductor substrate between the third source region and the third drain region; and
a third conductive structure overlying the third channel region and substantially rigidly attached to the semiconductor substrate.

16. A semiconductor sensing device, comprising:
a semiconductor substrate having a major surface and a first trench formed therein, the first trench having a first sidewall substantially perpendicular to the major surface;
a first source region in the semiconductor substrate adjacent the first sidewall of the first trench;
a first drain region in the semiconductor substrate adjacent the first sidewall of the first trench;
a first channel region in the semiconductor substrate between the first source region and the first drain region;
a first conductive structure overlying the first channel region and movable in a first direction substantially perpendicular to the first sidewall of the first trench;
a second source region in the semiconductor substrate adjacent the major surface;
a second drain region in the semiconductor substrate adjacent the major surface;
a second channel region in the semiconductor substrate between the second source region and the second drain region; and
a second conductive structure overlying the second channel region and movable in a second direction substantially perpendicular to the major surface,
wherein the semiconductor substrate further has a second trench formed therein, the second trench having a first sidewall substantially perpendicular to the major surface and to the first sidewall of the first trench, and wherein the semiconductor sensing device further comprises:
- a third source region in the semiconductor substrate adjacent the first sidewall of the second trench;
- a third drain region in the semiconductor substrate adjacent the first sidewall of the second trench;
- a third channel region in the semiconductor substrate between the third source region and the third drain region; and
- a third conductive structure overlying the third channel region and movable in a third direction substantially perpendicular to the first sidewall of the second trench.

17. The semiconductor sensing device of claim 16, wherein:

the second trench further has a second sidewall substantially parallel to the first sidewall of the second trench;

the semiconductor sensing device further comprises:
- a fourth source region in the semiconductor substrate adjacent the second sidewall of the second trench;
- a fourth drain region in the semiconductor substrate adjacent the second sidewall of the second trench; and
- a fourth channel region in the semiconductor substrate between the fourth source region and the fourth drain region; and the third conductive structure further overlies the fourth channel region.

* * * * *

UNITED STATES PATENT AND TRADEMARK OFFICE
CERTIFICATE OF CORRECTION

| | |
|---|---|
| PATENT NO. : 5,903,038 | Page 1 of 1 |
| DATED : May 11, 1999 | |
| INVENTOR(S) : Zuoying Lisa Zhang et al. | |

It is certified that error appears in the above-identified patent and that said Letters Patent is hereby corrected as shown below:

<u>Column 12,</u>
Line 36, delete "claims" and add -- claim --.
Line 42, delete "rate" and add -- gate --.
Line 63, delete "rate" and add -- gate --.

Signed and Sealed this

Seventh Day of May, 2002

Attest:

Attesting Officer

JAMES E. ROGAN
Director of the United States Patent and Trademark Office